(12) United States Patent
Kelly et al.

(10) Patent No.: US 8,299,393 B2
(45) Date of Patent: Oct. 30, 2012

(54) SELECTIVE THERMAL CONDITIONING COMPONENTS ON A PCB

(75) Inventors: Matthew S. Kelly, Oakville (CA); Kirit R. Shah, Cary, NC (US); Thomas S. Truman, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 253 days.

(21) Appl. No.: 12/857,767

(22) Filed: Aug. 17, 2010

(65) Prior Publication Data

US 2012/0043305 A1    Feb. 23, 2012

(51) Int. Cl.
*B23K 26/00* (2006.01)
(52) U.S. Cl. ......... 219/121.63; 219/121.64; 219/121.65; 228/180.1
(58) Field of Classification Search ...... 219/121.63–121.66, 121.85; 228/180.1
See application file for complete search history.

(56) References Cited

U.S. PATENT DOCUMENTS

| 6,168,064 | B1 * | 1/2001 | Berkin ............................... 228/9 |
| 6,304,427 | B1 | 10/2001 | Reed et al. |
| 6,560,514 | B1 | 5/2003 | Schultz et al. |
| 6,596,200 | B1 | 7/2003 | Ogawa et al. |
| 6,794,616 | B1 * | 9/2004 | Goenka .......................... 219/400 |
| 6,936,793 | B1 * | 8/2005 | Shiloh et al. .................. 219/400 |
| 2005/0072834 | A1 | 4/2005 | Zeng |
| 2005/0161252 | A1 | 7/2005 | Birgel |

OTHER PUBLICATIONS

Pan et al., "Effects of Reflow Profile and Thermal Conditioning on Intermetallic Compound Thickness for SnAgCu Soldered Joints", Soldering & Surface Mount Technology, vol. 21 Iss: 4, Emerald Group Publishing Limited, 2009, pp. 32-37.

Alhayek et al., "Experiments to Minimize Frequency Shifts and Yield Losses for Surface Mount Filters", Frequency Control Symposium, 1995. 49th., Proceedings of the 1995 IEEE International, pp. 832-837.

* cited by examiner

*Primary Examiner* — Minh-Loan T Tran
(74) *Attorney, Agent, or Firm* — Yee & Associates, P.C.; Steven L. Bennett (57) ABSTRACT

An embodiment of the invention comprises a method associated with a PCB having a first component, and a second component, that has substantially less thermal mass than the first component. During an initial time period, the PCB and its components are placed at an initial position proximate to a first heat source, which is operable to provide heat energy in accordance with a thermal profile comprising successive phases. After the initial time period, the first heat source is operated during each of the phases in accordance with the thermal profile to selectively apply heat to the PCB and to the plurality of components thereon. During the initial time period or a specified one of the phases, selectively, heat energy from a focused heat source is directed only to the first component, and not to other components.

20 Claims, 10 Drawing Sheets

SELECTIVE THERMAL CONDITIONING COMPONENTS ON A PCB

BACKGROUND

1. Field

The invention disclosed and claimed herein generally pertains to a method or procedure wherein heat is used to attach electronic components to a printed circuit board (PCB), or is used to detach components from a PCB. More particularly, the invention pertains to a method of the above type, wherein the thermal mass of one or more components on the PCB is substantially greater than the thermal mass of other components thereon.

2. Description of the Related Art

Surface mount technology (SMT) is a procedure for constructing circuits wherein each electronic component is directly mounted onto the surface of a PCB. Typically, components are attached by applying a solder paste to the PCB, and placing the components within the solder paste. The components are thereby temporarily attached to their respective contact pads of the PCB, by the adherence of the paste. This assembly is then passed through a high temperature oven such as a convection reflow oven, which selectively applies heat to the assembly as specified by a thermal profile or reflow profile. This process causes the solder to melt and to then resolidify, thereby forming intermetallic connections between each of the electronic components and its contact pads on the PCB. Generally, the reflow profile includes several phases or segments. The completed assembly is referred to as a PCB assembly or PCBA.

Notwithstanding the benefits which they provide, currently available SMT procedures have certain drawbacks or disadvantages. For example, it is very common for a PCB assembly to include a component that has a thermal mass which is much greater than the thermal mass of other components of the assembly. As an example of this, an assembly component could be an integrated circuit that comprises a large ball grid array (BGA) package that has a high thermal mass. Accordingly, this component would require a correspondingly large amount of thermal energy during a preheat phase of the thermal profile. However, this amount of thermal energy could cause a second component of the PCB assembly, which has a much smaller thermal mass, to overheat. On the other hand, if the thermal energy supplied during preheat was selected to accommodate the second component, the BGA component could be insufficiently heated for a solder reflow phase of the profile. Generally, because a single pass through the oven is used for all the components of the PCBA, it may be difficult to provide a single reflow profile that is suitable to establish a proper SMT interconnection for each individual component of the PCBA. This in turn can affect the quality and reliability of the PCB assembly.

Problems of the above type can also be encountered, if a PCB assembly having components with very different thermal masses is passed through a vapor phase reflow oven, rather than a convection reflow oven. Moreover, if the assembly has a BGA component with a large thermal mass that must be removed for rework, application of sufficient heat to remove the BGA could overheat adjacent and/or bottom side mirrored components that have a much lower thermal mass, or could cause solder reflow of another BGA component on the same PCBA card.

SUMMARY

In accordance with embodiments of the invention, selective thermal conditioning is applied to certain components of a PCB assembly. One embodiment is directed to a method associated with a PCB and a plurality of components carried on the PCB, wherein the components include at least a first component and a second component, and the thermal mass of the first component is substantially greater than the thermal mass of the second component. The method includes, during an initial time period, placing the PCB and components thereon at an initial position with respect to a first heat source, wherein the first heat source is operable to provide heat in accordance with a thermal profile, comprising successive phases. After the initial time period, the PCB and components thereon are moved into the first heat source. Then, the first heat source is operated during each of the phases in accordance with the thermal profile to selectively apply heat energy to the PCB and the components thereon. During the initial time period or a specified one of the phases, selectively, a focused heat source is operated to direct heat energy to the first component, to provide the first component with a temperature during successive phases that is determined by the combined effect of heat energy received by the first component both from the first heat source, and from the focused heat source.

DETAILED DESCRIPTION

Figure 1:
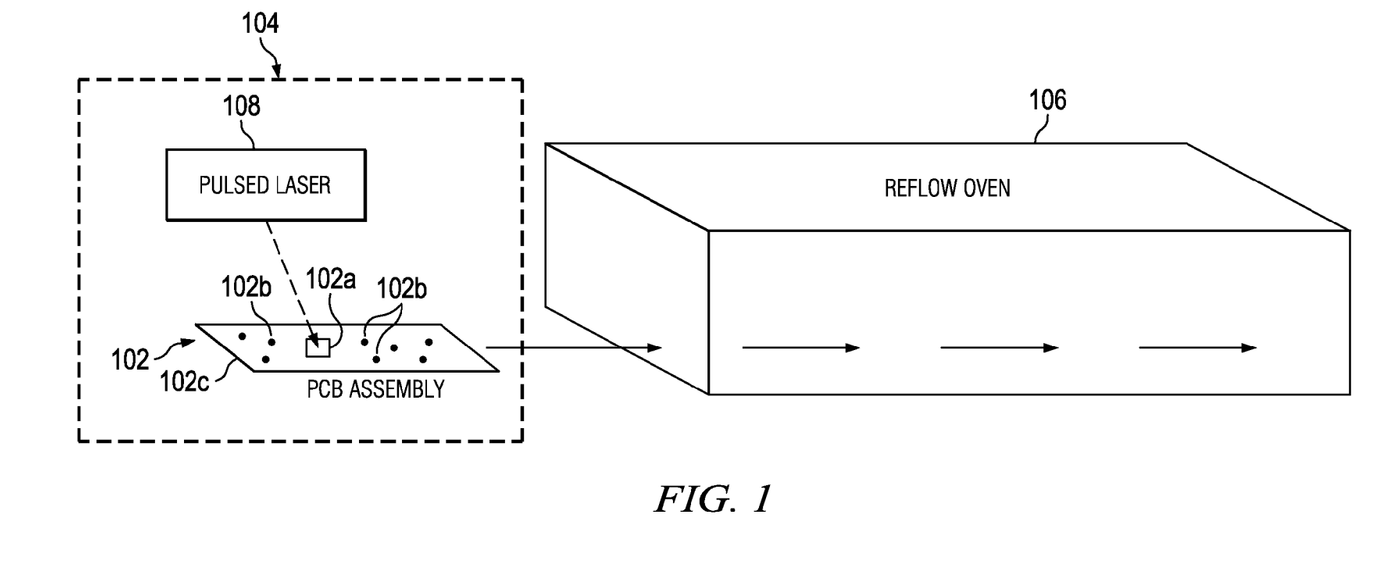
FIG. 1 is a schematic diagram for illustrating a first embodiment of the invention.

Referring to FIG. 1, there is shown a PCB assembly 102 comprising an electronic component 102a, electronic components 102b, and a board or card 102c. Respective components 102a and 102b in FIG. 1 are initially bonded to board 102c by means of a conventional solder paste (not shown), in accordance with a procedure as described above. Component 102a comprises, as an example, a large integrated circuit BGA package. Components 102b respectively comprise smaller electronic components that support component 102a. Accordingly, the thermal mass of component 102a is substantially greater than the thermal mass of each component 102b. By way of example and not limitation, the thermal mass of BGA component 102a could be 4 times greater than the thermal mass of a component 102b.

FIG. 1 shows PCB assembly 102 located at an initial position or station 104, which is proximate to an entry port of a reflow oven 106. Assembly 102 can thus be readily loaded or inserted into reflow oven 106, which is a heating device of a type known in the art for fabricating PCBAs. Reflow oven 106 is provided with a belt or other mechanism (not shown) for moving a PCB assembly 102 through a number of sequential phases or stages established within reflow oven 106. The oven is configured to apply amounts of thermal or heat energy to assembly 102, in order to selectively vary the temperature of assembly 102 as it moves through successive phases. More particularly, reflow oven 106 is operated to cause the temperature of the assembly to follow, or to vary according to, a specified thermal profile as the assembly moves through respective phases.

Figure 2:
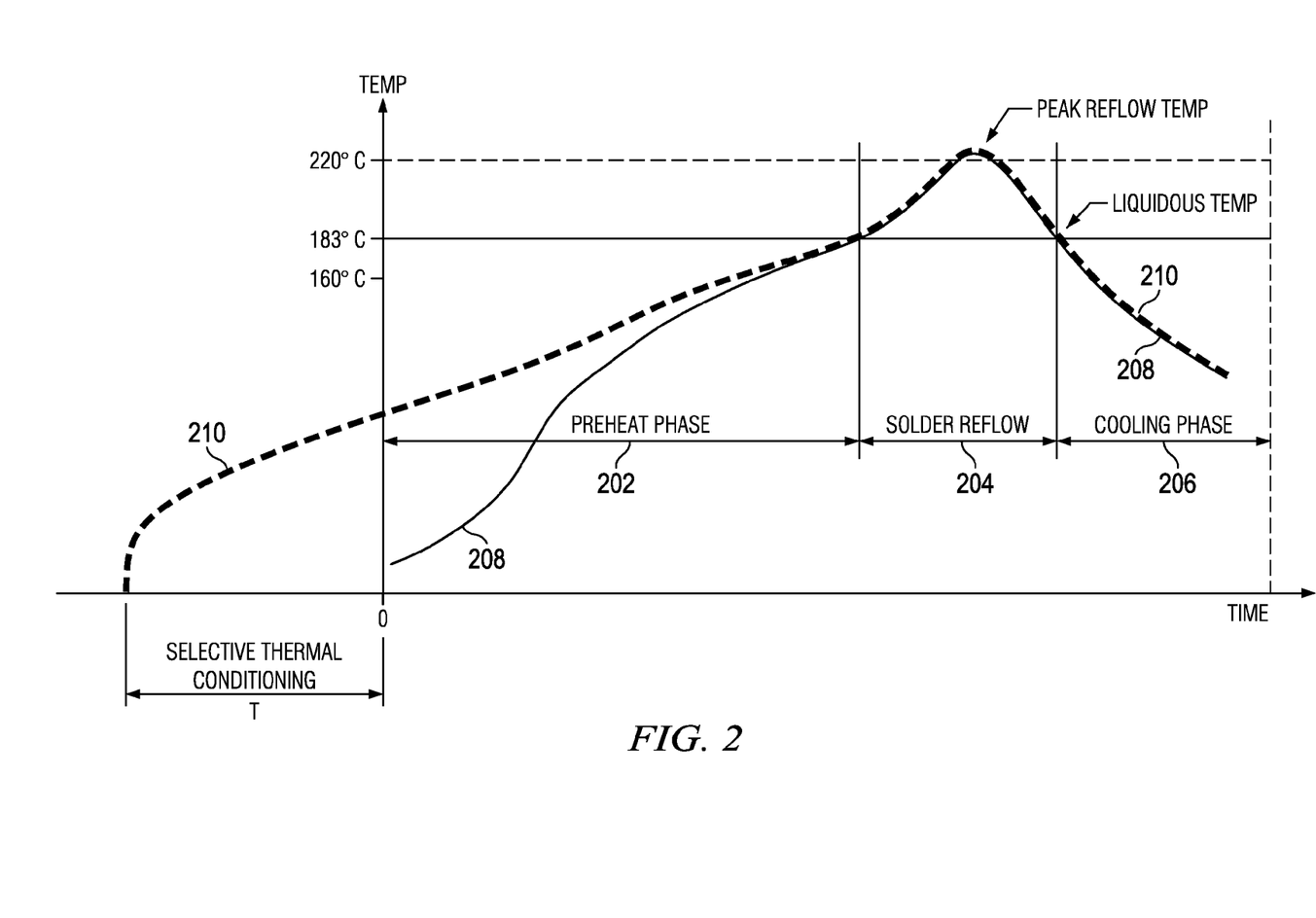
FIG. 2 is a graph depicting a thermal profile for the embodiment of FIG. 1.

Referring to FIG. 2, there are shown several phases pertaining to the operation of reflow oven 106. During a preheat phase 202, each of the components of PCB assembly 102 is heated up to the temperature at which solder in the solder paste liquefies. For example, this melting temperature may be around 183° C. for eutectic SnPb assembly, and 217 C for SnCuAg based lead-free assembly for some embodiments of the invention. During solder reflow phase 204, the solder is in a liquid state and is thus able to flow between the electronic components and their respective pads. The time of this phase is referred to as time above liquidous (TAL). FIG. 2 further shows a cooling phase 206. During this phase, the assembly 102 is gradually cooled to solidify the solder joints.

Referring further to FIG. 2, there is shown a time-temperature profile 208 of PCB assembly 102. Profile 208 indicates the temperature of assembly 102 over time, as it travels through respective phases shown by FIG. 2.

It is to be appreciated that as the assembly moves through preheat phase 202, each of the components 102a and 102b must be heated sufficiently to reach the liquidous temperature at which the solder will melt. Because the thermal mass of component 102a is much greater than the thermal mass of component 102b, substantially more thermal or heat energy is required to raise the temperature of component 102a to a specified level, than is required to raise the temperature of components 102b to such level. However, component 102a and components 102b are adjacent to each other on PCB assembly 102. Thus, the same amount of thermal energy furnished by oven 106 during the preheat phase is applied to both the BGA component 102a and each of the smaller components 102b. As described above, if the amount of thermal energy provided during the preheat phase is selected to meet the requirements of the smaller components 102b, such amount may be inadequate for the large BGA component to have proper solder reflow. If the amount of thermal energy is selected to ensure that BGA component 102a is heated sufficiently during the preheat phase, smaller components 102b may be heated to temperatures that exceed their maximum limits.

In order to overcome this situation in embodiments of the invention, selective thermal conditioning is used, in order to provide the appropriate amounts of thermal energy for both large component 102a and smaller components 102b of PCB assembly 102, during preheat phase 202. The selective thermal conditioning is achieved by imparting a controlled amount of thermal energy specifically to the BGA component 102a on PCB card 102c. In the embodiment illustrated by FIGS. 1 and 2, this energy is imparted while PCB assembly 102 is at station 104, just before entering reflow oven 106. However, none of this energy is directed to any of the other components on PCB card 102c.

Referring further to FIG. 1, there is shown a focused heat source 108, usefully comprising a pulse modulated laser (or alternative focused heat source) located at station 104. The focused heat source is configured to focus or direct a predetermined amount of thermal energy only to BGA component 102a of assembly 102. The focused heat source is thus configured further to prevent directing or imparting thermal energy to any of the components 102b. The pulse modulated laser may be used, for example, in connection with a closed loop feedback system (not shown). In another embodiment, the focused heat source could comprise a focused IR heat source.

Referring further to FIG. 2, it is seen that focused heat source 108 is operated for a time period T, just before PCB assembly 102 is loaded into oven 106 to commence preheat phase 202. The amount of heat applied to BGA component 102a by the focused heat source 108 is predetermined, to heat component 102a so that the temperature of component 102a will follow a profile 210. Profile 210 is depicted in FIG. 2 as a heavy dashed line. Also, during the preheat phase 202, components 102b of assembly 102 receive thermal energy from oven 106 so that their respective temperatures will follow a profile 208. Profile 208 and the amount of thermal energy provided by oven 106 are predetermined to ensure that none of the components 102b becomes overheated, before reaching solder reflow phase 204.

During the preheat phase 202, BGA component 102a also receives thermal energy from oven 106. Accordingly, profile 210 and the amount of energy provided by focused source 108, as described above, are judiciously selected to ensure that the total thermal energy provided to component 102a, from both sources, will heat component 102a sufficiently to achieve proper solder reflow. FIG. 2 further shows that profiles 208 and 210 are coincident with each other during the solder reflow and cooling phases.

It is to be appreciated that oven 106 may comprise or be adapted from a conventional convection reflow oven. Thus, currently available reflow ovens and related tools, with little or no modification, can be used to implement the embodiment of FIGS. 1 and 2, together with a focused heat source 108.

Figure 3:
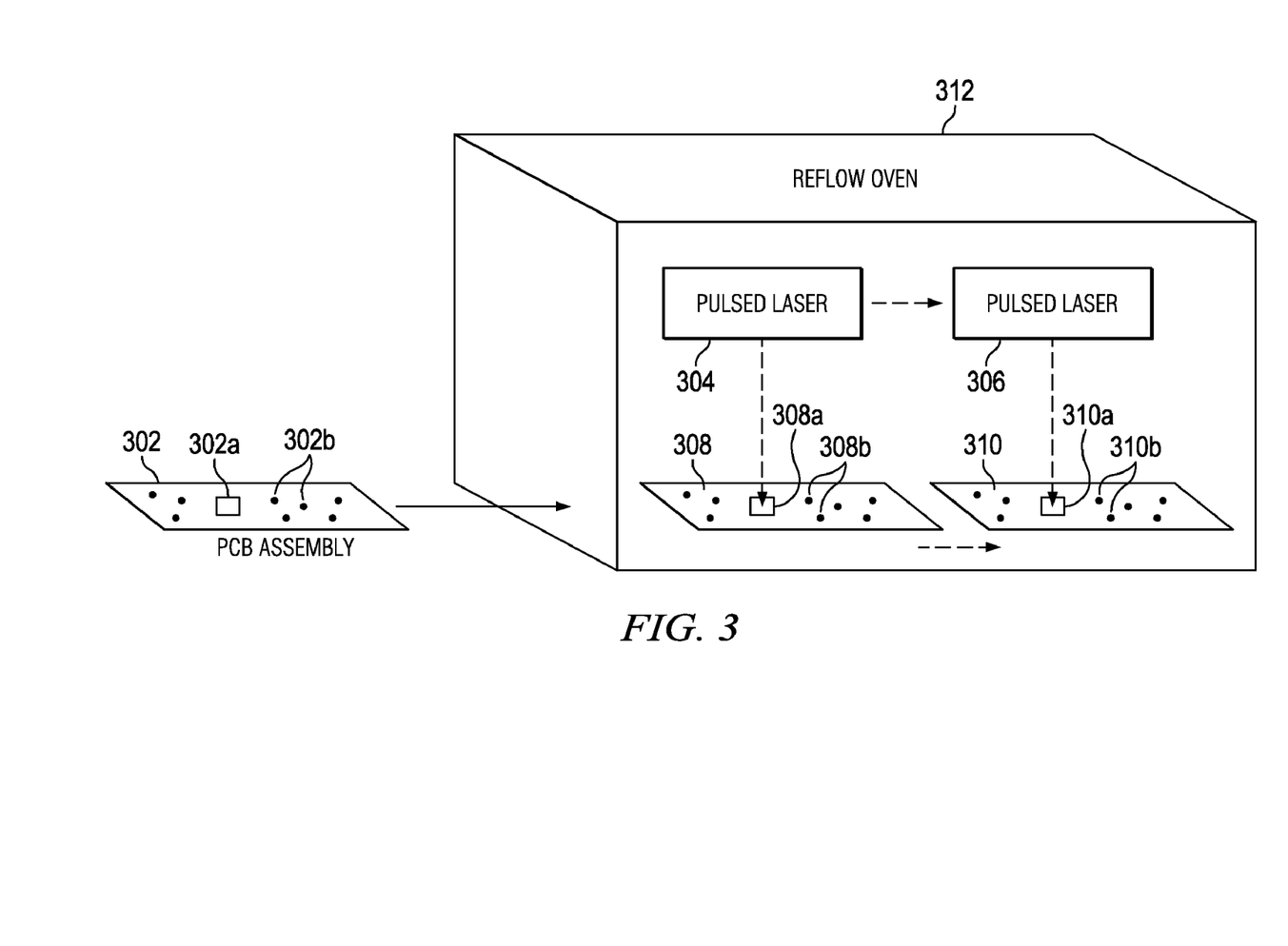
FIG. 3 is a schematic diagram for illustrating a second embodiment of the invention.

Referring to FIG. 3, there is shown a PCB assembly 302 positioned for loading into a reflow oven 312, similar to oven 106. Assembly 302 is similar or identical to assembly 102 described above, and comprises a BGA component 302a which has a large thermal mass, and further comprises electronic components 302b of substantially smaller thermal mass. FIG. 3 illustrates an embodiment of the invention which again provides selective thermal conditioning of component 302a of assembly 302. However, in this embodiment, the thermal conditioning of a PCB assembly takes place within the reflow oven during the preheat phase, rather than before the assembly enters the oven.

In the embodiment of FIG. 3, thermal conditioning is implemented by means of a focused heat source that may comprise multiple focused heat devices, such as pulse modulated lasers 304 and 306. When a PCB assembly such as an assembly 308 first enters oven 312, at the beginning of the preheat phase, pulsed laser heat source 304 is assigned to focus thermal energy onto component 308a of assembly 308, wherein component 308a has a large thermal mass. However, the heat source does not provide any thermal energy to any of the components 308b, which each has a substantially smaller thermal mass. As the PCB assembly 308 moves through the preheat phase, its assigned focused heat source moves with it, and continues to direct or apply thermal energy only to the component 308a of assembly 308.

FIG. 3 further shows pulse modulated laser 306 assigned to PCB assembly 310, to provide thermal energy to component 310a which has a large thermal mass, but to not provide thermal energy to components 310b, which each has a much smaller thermal mass.

Figure 4:
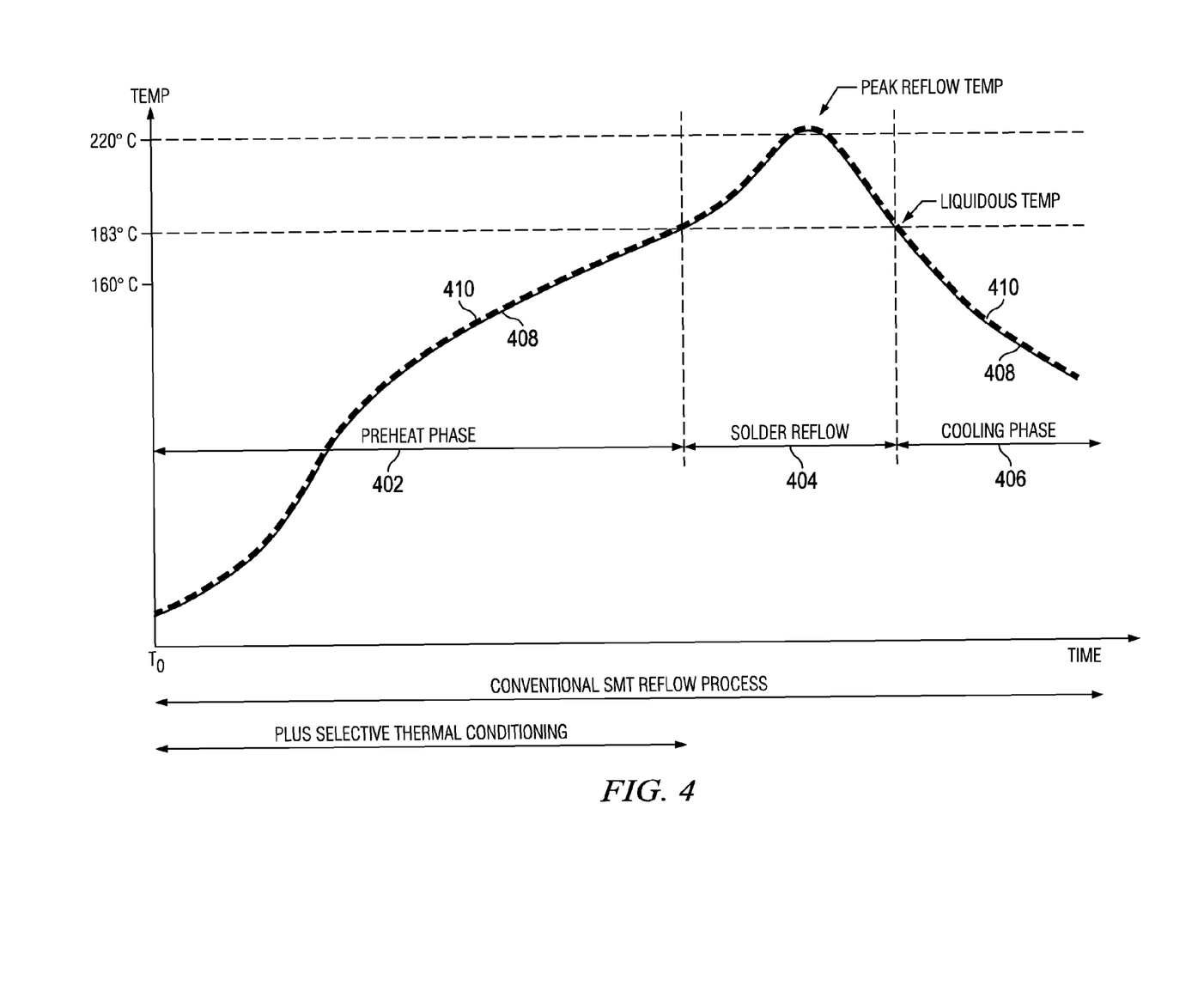
FIG. 4 is a graph depicting a thermal profile for the embodiment of FIG. 3.

Referring to FIG. 4, there is shown the time-temperature profile 408 of a PCB assembly such as assembly 308, as it is moved through preheat phase 402, solder reflow phase 404 and cooling phase 406 of reflow oven 312. During preheat phase 402, component 308a of assembly 308 receives thermal energy from focused laser 304 as described above. Thus, component 308a receives thermal energy from oven 312 in the course of the reflow process, and receives thermal energy from laser 304, as the selective thermal conditioning procedure is implemented. By judiciously selecting the amount of energy which is applied to component 308a by the thermal conditioning procedure, the cumulative thermal energy received by component 308a from both sources will cause the temperature of component 308a to follow a profile 410, as assembly 308 is moved through successive phases. Profile 410 is depicted in FIG. 4 as a heavy dashed line. FIG. 4 also shows that profile 410 substantially coincides with profile 408. This indicates that all components of the PCB assembly will reach the liquidous temperature at the same time. Moreover, profile 408 is selected so that overheating of the smaller components 308b of PCB assembly 308 will be avoided.

Figure 5:
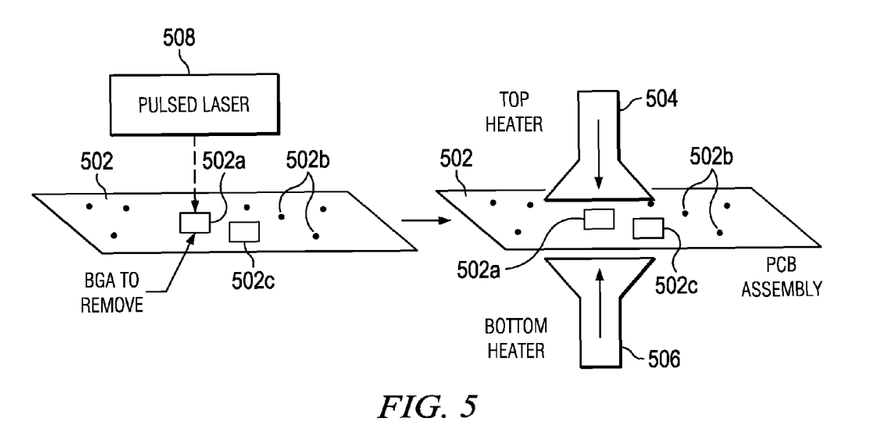
FIG. 5 is a schematic diagram for illustrating a third embodiment of the invention.

Referring to FIG. 5, there is shown a previously fabricated PCB assembly 502 that has a BGA component 502a. Component 502a has a substantial thermal mass, and requires rework of some kind. Accordingly, it is necessary to remove component 502a from assembly 502, by heating and melting the solder joints that hold component 502a to the assembly 502. This task is to be carried out by means of a hot gas nozzle comprising a top heater 504 and a bottom heater 506. FIG. 5 in fact shows PCB assembly 502 in two positions, i.e. an initial position, and a working position to the right of the initial position as viewed in FIG. 5. At the working position, BGA component 502a is positioned between top heater 504 and bottom heater 506, to receive heat therefrom.

To remove BGA component 502a, the top heater and bottom heater must increase component 502a to a package temperature that is above the solder liquidous temperature. Because component 502 has a large thermal mass, a substantial amount of thermal energy must be applied to component 502a, in order to reach the required temperature. However, FIG. 5 shows smaller components 502b mounted nearby on assembly 502, and further shows another BGA component 502c mounted thereon, adjacent to component 502a. If too much thermal energy is delivered to assembly 502, components 502b may be heated above their maximum temperature limits. Also, unintended solder reflow could occur at the adjacent BGA component 502c, creating additional reliability risks to the finished printed circuit board assembly.

In view of these concerns, a selective thermal conditioning procedure is carried out when PCB assembly 502 is at the initial position shown in FIG. 5. A focused heat source of the type described above, such as a pulse modulated laser 508, is operated to furnish a predetermined amount of thermal energy to component 502a, in conjunction with the amount of heat provided by the bottom heater. However, laser 508 does not direct thermal energy to other components of assembly 502. As a result, the target BGA component 502a enters the hot gas removal fixture, between the top and bottom heaters, at an elevated temperature above the rest of the components on the assembly card. Also, the heat provided by the bottom heater can be reduced, thus resulting in a lower temperature from the hot gas nozzle and an overall lower peak temperature during the BGA reflow/removal phase of the BGA component 502a. This procedure allows the pads of component 502a to be effectively soldered, without excessive peak temperatures, and without overheating the PCB assembly 502 and other components thereon which are adjacent to component 502a. Moreover, adjacent BGA component 502c does not reach a liquidous temperature, and secondary reflow in regard to such component is avoided.

Figure 6:
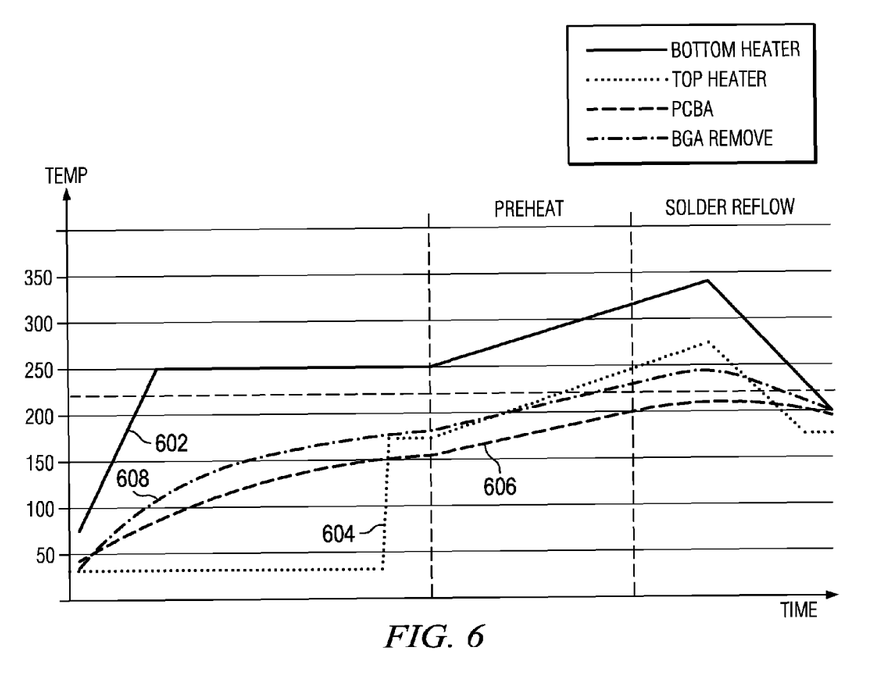
FIG. 6 is a graph depicting a thermal profile for the embodiment of FIG. 5.

Referring to FIG. 6, there is shown time-temperature profile 602 of bottom heater 506, during preheat and solder reflow phases of the procedure described above. There is also shown the profile 604 of top heater 504, as well as the profile 606 of PCB assembly 502, and the profile 608 of BGA component 502a, which is to be removed. FIG. 6 clearly illustrates that when the solder reflow phase is reached, the temperature of component 502a is significantly higher than the temperature of assembly 502 and its remaining components, so that component 502a may be removed while the remaining components are unaffected. This is achieved by operating pulse laser 508 as described above during the preheat phase of FIG. 6.

In an alternative embodiment of the invention, a focused heat source, such as a focused IR heat source could be used instead of pulse modulated laser 508.

Figure 7:
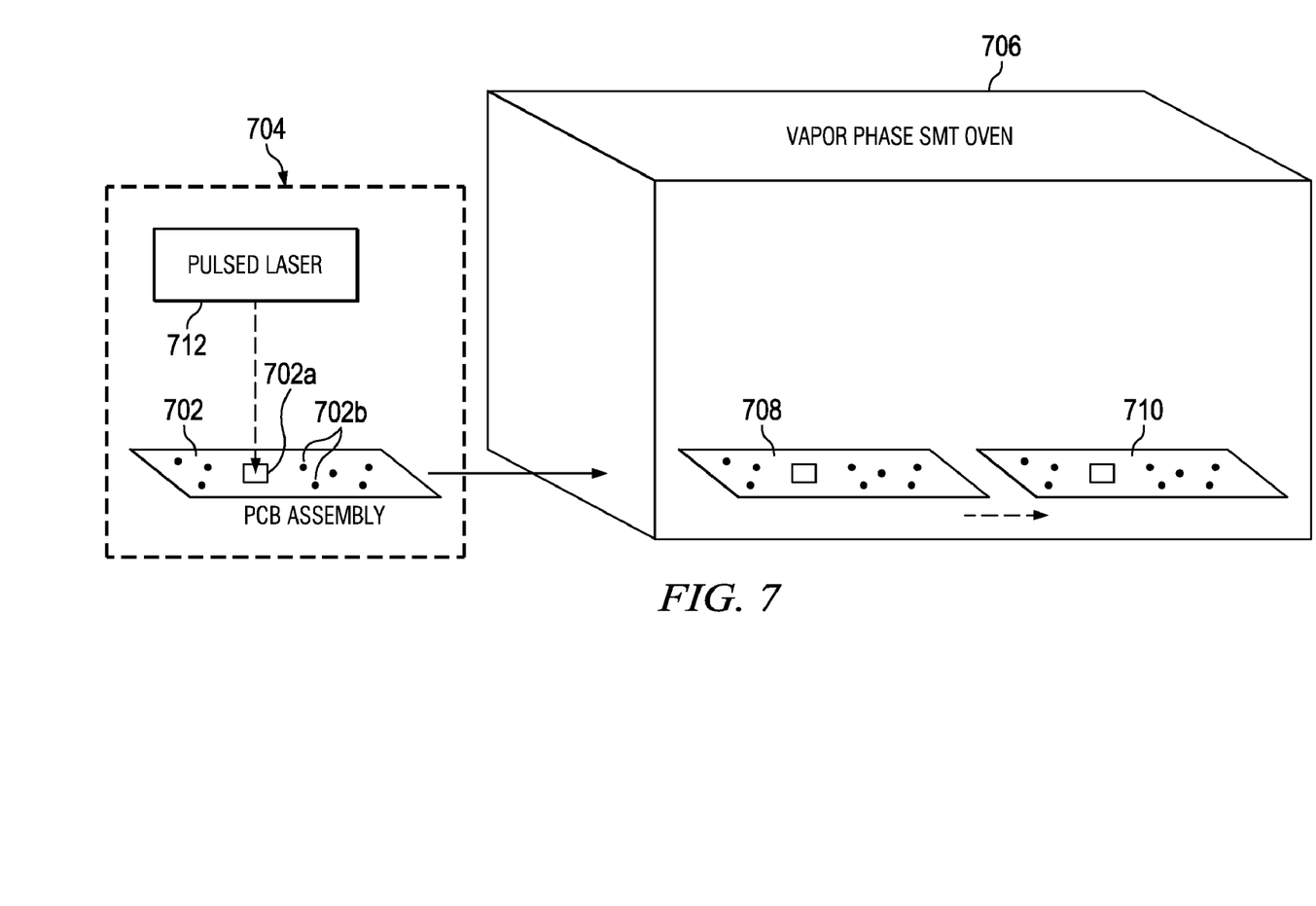
FIG. 7 is a schematic diagram for illustrating a fourth embodiment of the invention.

Referring to FIG. 7, there is shown a PCB assembly 702 at a preheat station 704, prior to loading the assembly into a vapor phase oven 706 for vapor phase reflow soldering. Assembly 702 includes a BGA component 702a of large thermal mass, and further includes components such as 702b that are each of much smaller thermal mass. Vapor phase reflow soldering is often used for thermally massive, complex, high reliability PCB assemblies. This reflow technology is very useful in fabricating, for example, large server planar backplane PCBAs which can be on the order of 0.250 inches thick and 18×24 inches in dimension. An important advantage of vapor phase soldering is the elimination of temperature gradients during vapor phase reflow, that is, differences between the temperatures of different PCB components. A preheat operation for PCB assembly 702 is carried out at preheat station 704. FIG. 7 further shows PCB assemblies 708 and 710 moving through oven 706.

Figure 8:
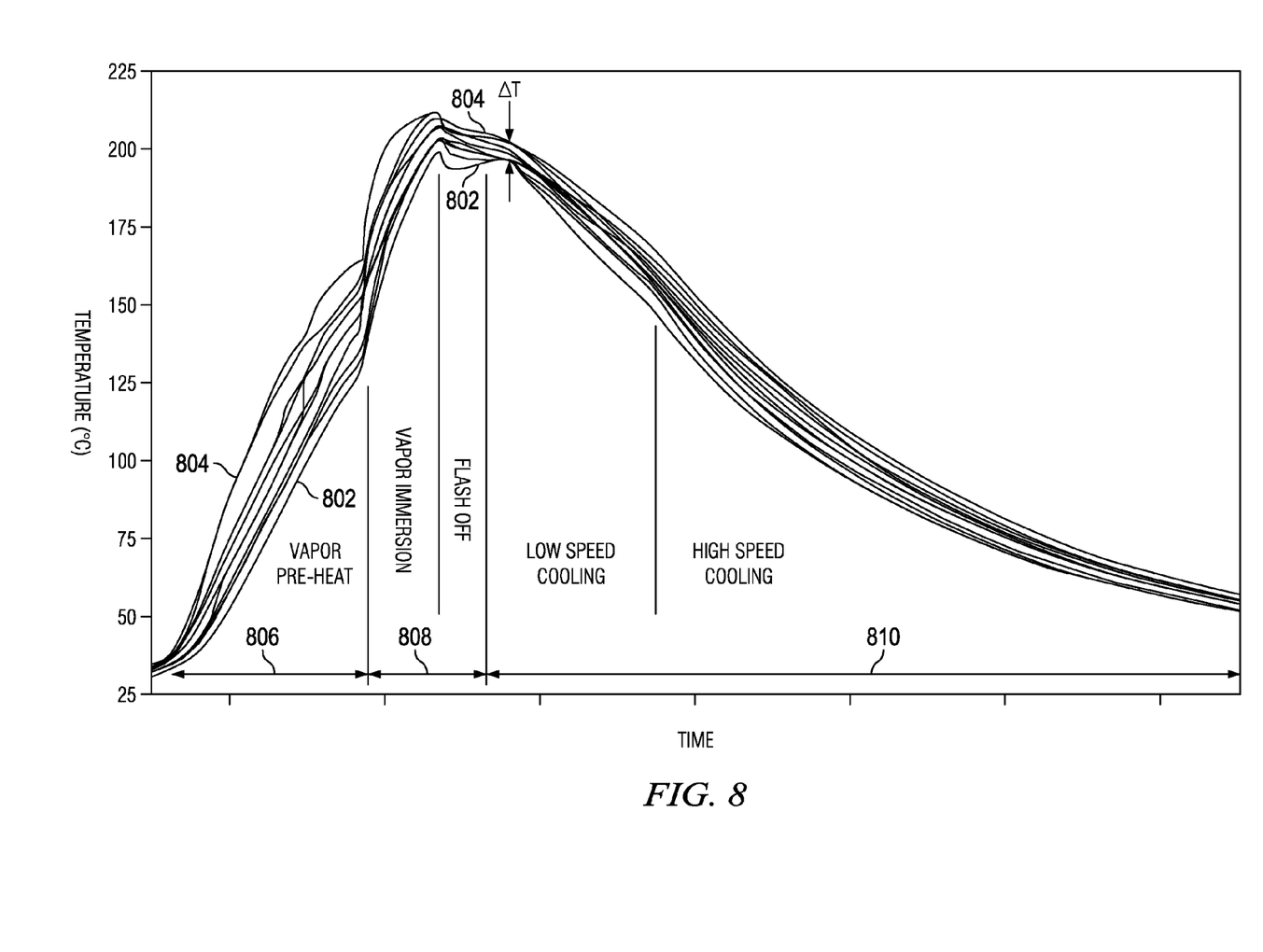
FIG. 8 is a graph depicting a thermal profile for the embodiment of FIG. 7.

Referring to FIG. 8, there is shown the time-temperature profile of a PCB assembly 702 during a vapor phase reflow soldering procedure, as described above. FIG. 8 shows that the profile has a preheat phase 806, a vapor reflow phase 808, and a cooling phase 810. More particularly, FIG. 8 illustrates the profiles of respective individual PCB components during vapor phase soldering, such as profile 802 for component 702a, and profile 804 for a component 702b. Because of the great differences in thermal mass that can occur between different components on the same assembly board, there can be significant gradients between temperatures of different components during the process of oven 706. FIG. 8 shows delta T, which provides a measure of this temperate gradient or difference. It is generally desirable for delta T to be as small as possible.

As described above, vapor phase soldering provides very good delta T control during the reflow portion of such process. However, because of the tooling which is often used, vapor phase soldering has generally offered poor delta T control during the preheat phase. To overcome this problem, an embodiment of the invention implements selective thermal conditioning of a PCB assembly at the preheat phase, such as at preheat station 704 of FIG. 7. FIG. 7 more particularly shows a focused heat source comprising a pulse modulated laser 712, which supplies a predetermined amount of thermal energy to BGA component 702a, before assembly 702 enters oven 706. However, laser 712 does not provide any thermal energy to other components of assembly 702. In an alternative embodiment, focused heat source could comprise a different device, such as a focused IR source.

The embodiment of FIGS. 7 and 8 minimizes the temperature gradients often found during vapor phase preheat stages, and this improves delta T control. Such improved control leads to improved flux activation across large assemblies, to improved overall solder joint reliability, and to improved first pass yields of backplane assemblies. This embodiment also lowers overall heating of the PCBA assembly, thereby reducing the exposure of temperature sensitive components and the PCB. The embodiment further ensures uniform flux activation during preheat, resulting in more uniform solder joint interconnect formations for higher reliability assemblies, and improves first pass yields of expensive PCBAs.

Figure 9:
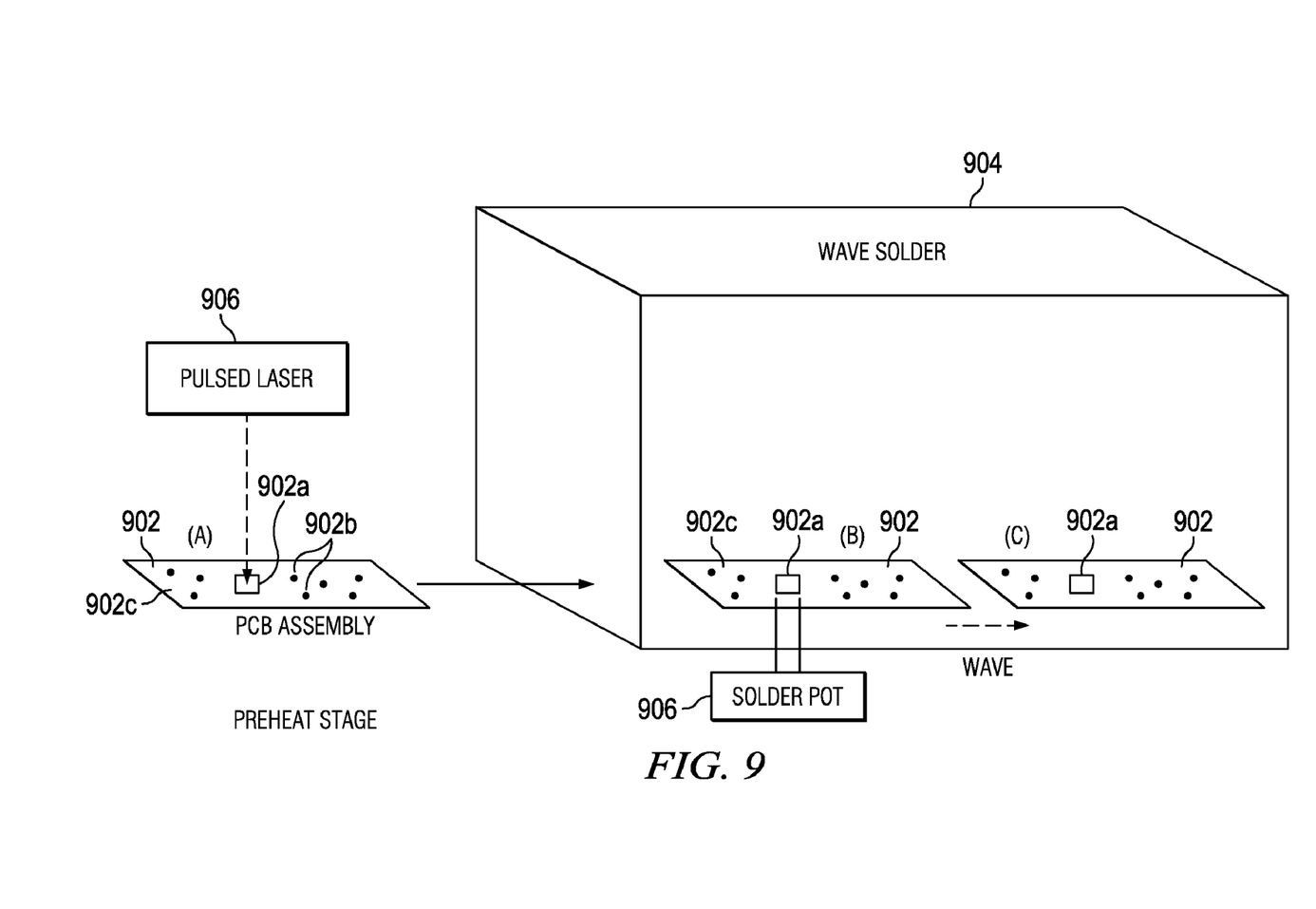
FIG. 9 is a schematic diagram for illustrating a fifth embodiment of the invention.

Referring to FIG. 9, there is shown a PCB assembly 902, at successive locations (A), (B) and (C) with respect to a wave soldering machine 904. Assembly 902 comprises pin through hole (PTH) solder tail component (such as a PTH connector) 902a of large thermal mass, and components 902b of smaller thermal mass. Component 902a has pins (not shown) which are each inserted through a complementary hole (not shown) formed through the board or card 902c of assembly 902. The pins of component 902a, when inserted through their holes, are brought into contact with copper vias (not shown) of board 902c. As is known by those of skill in the art, vias are pads with plated holes that provide electrical connections between copper traces on different layers of the board.

The above type of connection for a PCB assembly is known as a pin through hole (PTH) connection. In order to securely attach component 902a to board 902c, PCB assembly 902 is initially heated at location (A), during a preheat phase or stage. Assembly 902 is then moved into location (B). At this location the pins of component 902a and the corresponding holes of board 902c are passing directly over a solder pot 906 of molten solder. Solder flows at least partially up into the holes and around the pins and vias, to join the pins and vias together. Assembly 902 is then moved to location (C), and cooling takes place to solidify the solder.

In the wave soldering process, it is important to have each hole, or barrel, contain as much solder as possible. For reliability reasons, vias should have 50% solder hole fill for ground connections and 75% solder hole fill for signal connections. However, in a PCB assembly, the PCB thickness, internal copper ground plane weights, and the via barrel diameter directly affect the ability of the molten solder to flow or wick up into the via through capillary action. For example, as the number of connectors to ground planes increases, heat dissipation likewise increases. This in turn increases cooling of the solder, so that the solder becomes more viscous. Solder is thus less able to flow up into the holes, as the PCB assembly passes over the solder wave. Also, certain areas of the board 902c can act as thermal heat sinks, and cause the solder to solidify before complete hole fill occurs.

Referring further to FIG. 9, there is shown a focused heat source at location (A), which comprises a pulse modulated laser 906. The focused heat source could alternatively be a focused IR heat source. Laser 906 is operated at the preheat phase to provide selective thermal conditioning, by directing heat to vias adjacent to the pins of PTH solder tail component 902a. A predetermined amount of heat energy is thus added to target vias, before PCB assembly 902 enters the wave solder phase. As a result, solder will more effectively fill the holes proximate to the vias, during wave soldering.

Figure 10:
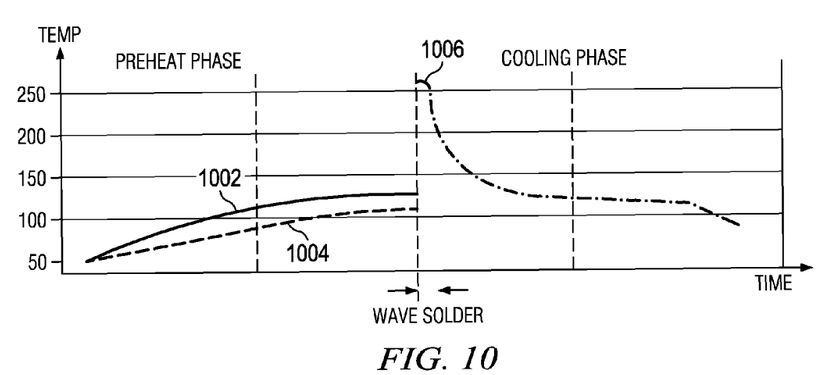
FIG. 10 is a graph depicting a thermal profile for the embodiment of FIG. 9.

Referring to FIG. 10, there is shown the time-temperature profile 1002 of PTH solder tail component 902a, as a result of the heat provided by the focused laser source 906. Profile 1004 is the time-temperature profile of other components of PCB assembly 902 during the preheat phase. During the wave soldering process the profiles 1002 and 1004 both spike upward. The two profiles then combine and decline in temperature during the cooling phase, as shown by profile 1006.

By providing the selective conditioning procedure as described above, there is lower overall heating of PCB assembly 902, which reduces the exposure of temperature sensitive components of the PCB. Also, thermal conditioning applied to PTH barrels maintains lower solder viscosity for a longer period of time, and thus provides better hole fill for thick PCB cards. This results in better reliability performance, after attachment of components using wave soldering.

The thermal conditioning of FIGS. 9 and 10 can also be used in connection with a solder fountain, or mini pot of molten solder. A solder fountain may be used in connection with rework, wherein pins of a component are to be connected to copper vias of a PCB.

A PCB assembly can include a BGA or other component that has a high thermal mass, and can also include other components that each has a much smaller thermal mass. In the operation of a convection reflow oven, a single pass through the oven is typically used to attach all the components to the PCB. Because of the wide range of thermal mass, problems can occur during the cooling phase, in addition to the problems described above. For example, a BGA component could become warped during the cooling phase. This may cause severe stress on the solder interconnection below the liquidous temperature of the solder.

To illustrate this more specifically, the BGA component would be flat upon the PCB card at the beginning of the process. During the preheat and solder reflow phases, the high thermal gradient of the BGA component could cause concave substrate warping. When the temperature is stabilized, the substrate would relax back to being flat. However, during the cooling phase, the BGA substrate could experience a high negative thermal gradient, causing convex warping of the substrate. Then, upon falling below the solder liquidous temperature, the assembly package would become frozen in shape. This could cause severe stress to the solder interconnection, as stated above.

Figure 11:
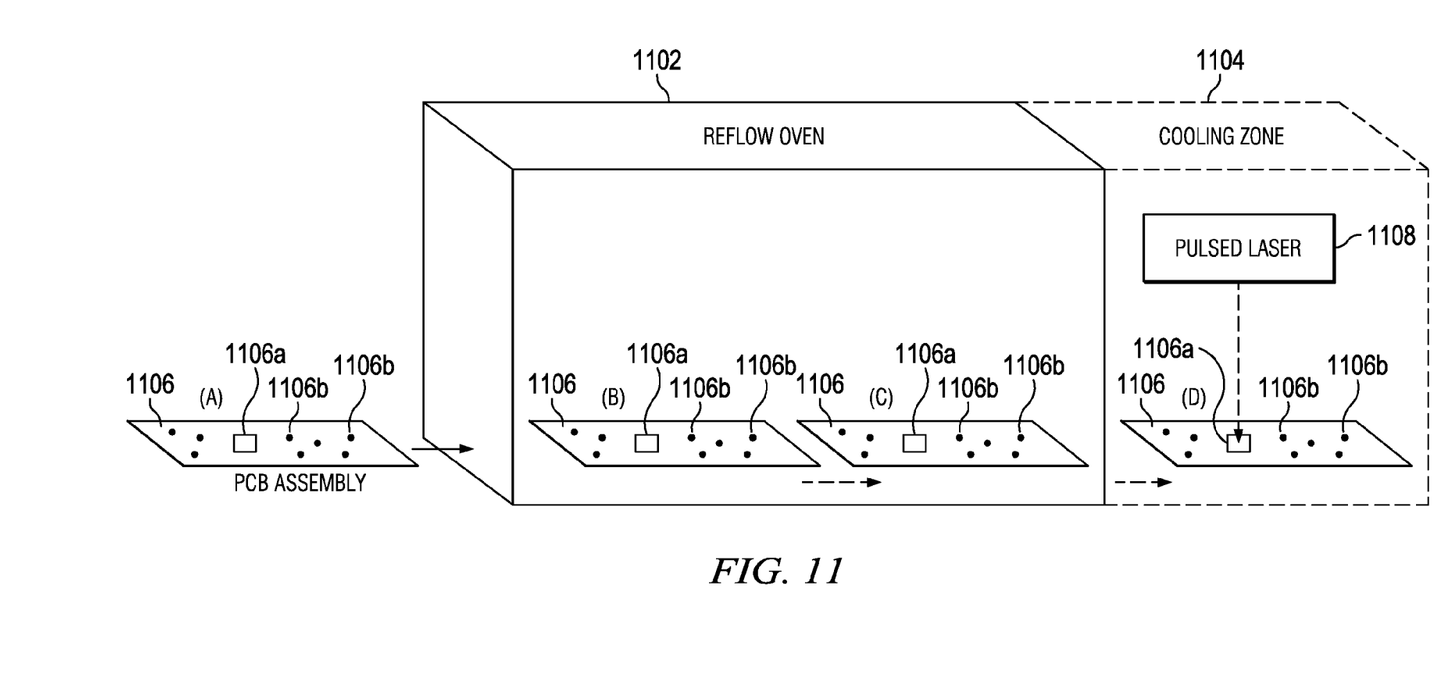
FIG. 11 is a schematic diagram for illustrating a sixth embodiment of the invention.

Referring to FIG. 11, there is shown an embodiment of the invention configured to overcome this problem. More particularly, there is shown a convection reflow oven 1102, similar or identical to oven 106 of FIG. 1. FIG. 11 also shows cooling zone 1104 in which the cooling phase of the reflow process takes place. FIG. 11 further shows a PCB assembly 1106, at successive locations (A), (B), (C) and (D) with respect to oven 1102. Assembly 1106 comprises a BGA component 1106a of large thermal mass, and components 1106b of smaller thermal mass.

Referring further to FIG. 11, there is shown a focused heat source comprising a pulse modulated laser 1108 at cooling zone 1104, which is also location (D) for PCB assembly 1106. When assembly 1106 is in the cooling zone, pulse laser 1108 is operated to provide selective thermal conditioning by directing heat energy to component 1106a of assembly 1106. This heat applied in the cooling zone has the effect of dampening the thermal shock of BGA component 1106a, and avoids the thermal warping that could otherwise occur.

Figure 12:
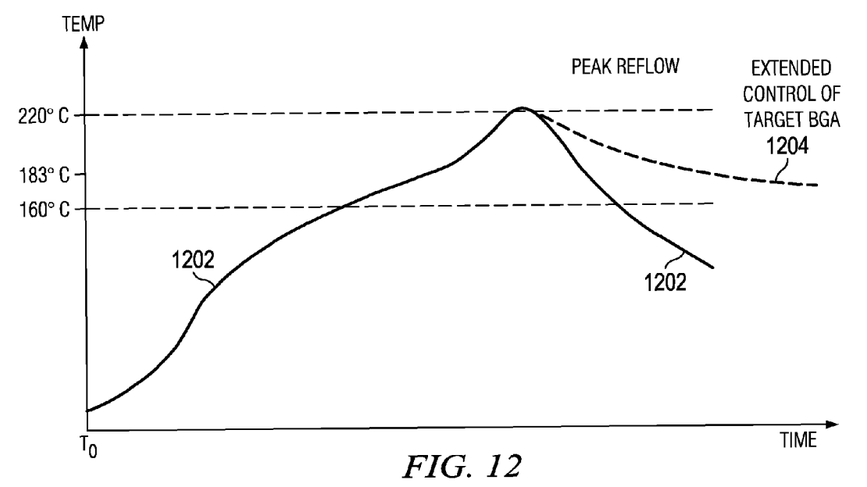
FIG. 12 is a graph depicting a thermal profile for the embodiment of FIG. 11.

Referring to FIG. 12, there is shown the time-temperature profile 1202 of PCB assembly 1106, as it proceeds through successive phases of the reflow process. The time-temperature profile of BGA component 1106a, as it is heated by the focused heating source 1108, is shown as profile 1204. In an alternative embodiment, the focused heat source could be a focused IR heat source.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention can take the form of an entirely hardware embodiment, an entirely software embodiment or an embodiment containing both hardware and software elements. In a preferred embodiment, the invention is implemented in software, which includes but is not limited to firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer readable medium can be any tangible apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. In association with a printed circuit board (PCB), and a plurality of electronic components on the PCB that include at least a first component and a second component, wherein the thermal mass of the first component is substantially greater than the thermal mass of the second component, a method comprising the steps of:
   during an initial time period, placing the PCB and components thereon at an initial position with respect to a first heat source, wherein the first heat source is operable to provide heat energy in accordance with a thermal profile comprising successive phases;
   after the initial time period, moving the PCB and components thereon into the first heat source;
   operating the first heat source during each of said phases in accordance with the thermal profile to selectively apply heat energy to the PCB and to the plurality of components thereon; and
   during said initial time period or a specified one of said phases, selectively, operating a focused heat source to direct heat energy to the first component, to provide the first component with a temperature during successive phases that is determined by the combined effect of heat energy received by the first component, both from the first heat source and from the focused heat source.

2. The method of claim 1, wherein:
   the first heat source comprises a reflow oven, the successive phases include preheat, reflow and cooling phases, and heat energy from the focused heat source is directed to the first component during the initial time period, before the PCB and the plurality of components carried thereon are moved from the initial position into the reflow oven.

3. The method of claim 1, wherein:
   the first heat source comprises an oven of specified type, the successive phases include a preheat phase, and energy from the focused heat source is directed to the first component during the preheat phase.

4. The method of claim 3, wherein:
   said oven comprises a reflow oven.

5. The method of claim 3, wherein:
   said oven comprises a vapor phase oven.

6. The method of claim 3, wherein:
   a plurality of PCBs are sequentially moved through said oven during the preheat phase, each PCB of said plurality having at least one of said first components and one of said second components, wherein one of a plurality of focused heat sources is assigned to each PCB to move with its assigned PCB through the preheat stage, and to direct heat energy to the first component of its assigned PCB during said movement.

7. The method of claim 1, wherein:
the plurality of components are each initially attached to the PCB by an intermetallic connection, and the first heat source comprises a fixture for applying heat energy to the first component; and
the focused heat source directs heat energy to the first component during a preheat phase, to cause the temperature of the first component to reach a first temperature which is sufficient to melt the intermetallic connection, while at the same time the temperature of the other components of the plurality each remains below a preselected second temperature which is less than the first temperature.

8. The method of claim 1, wherein:
the first component is provided with a set of connecting pins, the PCB is provided with holes for respectively receiving the pins and with vias corresponding to the holes, and the heat source comprises means for supplying molten solder for forming connections between respective pins and vias, during a soldering operation comprising a wave soldering operation or a solder fountain operation, selectively; and
the focused heat source directs energy to said vias prior to the soldering operation.

9. The method of claim 1, wherein:
the first heat source comprises a reflow oven, the successive phases include a preheat phase, a reflow phase and a cooling phase, and energy from the focused heat source is directed to the first component during the cooling phase.

10. The method of claim 1, wherein:
the focused heat source comprises a pulse modulated laser or a focused IR heat source, selectively.

11. In association with a printed circuit board (PCB), and a plurality of electronic components on the PCB that include at least a first component and a second component, wherein the thermal mass of the first component is substantially greater than the thermal mass of the second component, an apparatus comprising:
a work station provided with a position for placement of the PCB and the components carried thereon during an initial time period;
a first heat source located proximate to the work station, wherein the first heat source is operable to receive the PCB, and is further operable to selectively apply heat energy to the PCB and to the plurality of components carried thereon in accordance with a specified thermal profile comprising successive phases; and
at least one focused heat source which is operable during said initial time period or a specified one of said phases, selectively, for directing heat energy to the first component, to provide the first component with a temperature during successive phases that is determined by the combined effect of heat energy received by the first component, both from the first heat source and from the focused heat source.

12. The apparatus of claim 11, wherein:
the first heat source comprises a reflow oven, and the focused heat source is disposed for operation to direct heat energy to the first component during the initial time period.

13. The apparatus of claim 11, wherein:
the first heat source comprises a reflow oven, the thermal profile includes a preheat phase, and the focused heat source is operable to direct heat energy to the first component during the preheat phase.

14. The apparatus of claim 11, wherein:
the first heat source comprises a vapor phase oven, the thermal profile includes a preheat phase, and the focused heat source is operable to direct heat energy to the first component during the preheat phase.

15. The apparatus of claim 11, wherein:
the plurality of components are each initially attached to the PCB by an intermetallic connection, and the first heat source comprises a fixture for applying heat energy to the first component; and
the focused heat source comprises means for directing heat energy to the first component during a preheat stage, to cause the temperature of the first component to reach a first temperature which is sufficient to melt the intermetallic connection, while at the same time the temperature of the other components of the plurality each remains below a preselected second temperature which is less than the first temperature.

16. The apparatus of claim 11, wherein:
a plurality of PCBs are sequentially moved through the first heat source during a preheat phase, each PCB of said plurality leaving at least one of said first components and one of said second components, wherein the focused heat source comprises one of a plurality of focused heat sources that are each assigned to one of said PCBs, each focused heat source being adapted to move with its assigned PCB through the preheat stage, and to direct heat energy to the first component of its assigned PCB during said movement.

17. Thermal conditioning apparatus comprising:
a specified oven disposed to receive a printed circuit board (PCB) and also a plurality of electronic components carried on the PCB that include at least a first component and a second component, wherein the thermal mass of the first component is substantially greater than the thermal mass of the second component, the specified oven being operable to move the PCB and components thereon through successive phases that include a preheat phase, and to apply heat energy to the PCB and components thereon during successive phases in accordance with a specified thermal profile; and
a focused heat source located in selected relation to the specified oven, the focused heat source being operable to direct heat energy to the first component to provide the first component with a temperature during successive phases that is determined by the combined effect of heat energy received by the first component both from the first heat source, and from the focused heat source.

18. The apparatus of claim 17, wherein;
the focused heat source directs heat energy to the first component during said preheat phase, or before the PCB and components thereon are received by the specified oven, selectively.

19. The apparatus of claim 17, wherein:
the specified oven comprises a reflow oven.

20. The apparatus of claim 17, wherein:
the specified oven comprises a vapor phase oven.

* * * * *